(12) United States Patent
Pelgrom et al.

(10) Patent No.: US 8,203,368 B2
(45) Date of Patent: Jun. 19, 2012

(54) DLL FOR PERIOD JITTER MEASUREMENT

(75) Inventors: Marcel J. M. Pelgrom, Helmond (NL);
Hendricus Joseph Maria Veendrick, Heeze (NL); Victor Zieren, Valkenswaard (NL)

(73) Assignee: NXP B.V., Eindhoven (NL)

( * ) Notice: Subject to any disclaimer, the term of this patent is extended or adjusted under 35 U.S.C. 154(b) by 27 days.

(21) Appl. No.: 12/995,153

(22) PCT Filed: May 27, 2009

(86) PCT No.: PCT/IB2009/052214
§ 371 (c)(1),
(2), (4) Date: Jan. 7, 2011

(87) PCT Pub. No.: WO2009/144669
PCT Pub. Date: Dec. 3, 2009

(65) Prior Publication Data
US 2011/0128055 A1    Jun. 2, 2011

(30) Foreign Application Priority Data

May 29, 2008    (EP) ..................................... 08157142

(51) Int. Cl.
*H03L 7/06* (2006.01)
(52) U.S. Cl. ........................................ 327/156; 327/149
(58) Field of Classification Search .................... None
See application file for complete search history.

(56) References Cited

U.S. PATENT DOCUMENTS

| | | | |
|---|---|---|---|
| 6,208,169 B1 * | 3/2001 | Wong et al. ..................... | 326/93 |
| 7,308,372 B2 * | 12/2007 | Rifani et al. .................... | 702/69 |
| 7,538,570 B2 | 5/2009 | Pelgrom et al. | |
| 7,710,136 B2 | 5/2010 | Pelgrom et al. | |
| 7,816,960 B2 * | 10/2010 | Saint-Laurent et al. ...... | 327/158 |
| 2002/0053048 A1 | 5/2002 | Matsumoto | |
| 2004/0217788 A1 * | 11/2004 | Kim .............................. | 327/158 |
| 2005/0024037 A1 | 2/2005 | Fetzer | |
| 2006/0122806 A1 | 6/2006 | Rifani | |

(Continued)

FOREIGN PATENT DOCUMENTS

WO    2006056951 A1    6/2006

OTHER PUBLICATIONS

Petrescu, Violeta, et al; "A Signal-Integrity Self-Test Concept for Debugging Nanomeeter CMOS ICs"; ISSCC, Session 29.6; 10 Pages (Feb. 8, 2006).

(Continued)

*Primary Examiner* — Cassandra Cox (57) ABSTRACT

A sensor (400) for sensing jitter in a clock signal has a DLL (402, 310, 312) for locking a clock signal and a delayed version of the clock signal. The sensor comprises a delay line (402) having a first number of cascaded controllable delay segments. The DLL uses a second number of the cascaded delay segments for generating a delay of an average clock period of the clock signal. The second number is smaller than the first number. The sensor also has a comparator (408) for supplying a sensor output signal representative of a comparison of the clock signal and a further delayed version of the clock signal. The further delayed version of the clock signal is obtained from an output of a specific one of the delay segments located in the delay line after the second number of cascaded delay segments.

8 Claims, 4 Drawing Sheets

U.S. PATENT DOCUMENTS

2007/0079188 A1    4/2007   Veendrick
2008/0007246 A1    1/2008   Veendrick et al.
2008/0012549 A1    1/2008   Kam

OTHER PUBLICATIONS

Van De Beek, R.C.H., et al; "Analysis of Random Jitter in a Clock Multiplying DLL Architecture"; PRORISC 2001; pp. 281-287.

Petrescu, Violeta, et al; "Monitors for a Signal Integrity System"; ESSCIRC 2006, Montreus, pp. 122-125.

Henzler, S., et al; "A 90NM 4.7 PS-Resolution 0.7 LSB Single-Shot Precision and 19PJ-Per-Shot Local Passive Interpolation Time-To-Digital Converter With On-Chip Characterization"; ISSCC 2008, pp. 548-459.

\* cited by examiner

DLL FOR PERIOD JITTER MEASUREMENT

FIELD OF THE INVENTION

The invention relates to an electronic circuit comprising a sensor for sensing timing jitter in a clock signal.

BACKGROUND OF THE INVENTION

The idea of incorporating monitoring circuitry into product integrated circuits (ICs) is gaining relevance/momentum. A driving force behind this is that, as line widths decrease, IC performance errors become more frequent due to parasitic effects such as crosstalk, noise, etc. Although such monitoring circuitry requires some area on the IC and extra power, such drawbacks are greatly offset by the ability to monitor various IC parameters and address errors.

Accordingly, signal-integrity measurement systems are used in electronic circuitry, e.g., system-on-chip (SoC) circuits, and allow real-time monitoring of parameters that characterize the electrical behavior of the integrated circuit. These parameters give an indication of the circuit's robustness and performance during testing, debugging, or in operational use. Examples of such signal-integrity measurement systems are discussed in, e.g., US 20080007246, US 20070079188 and WO2006056951, all incorporated herein by reference.

Figure 1:
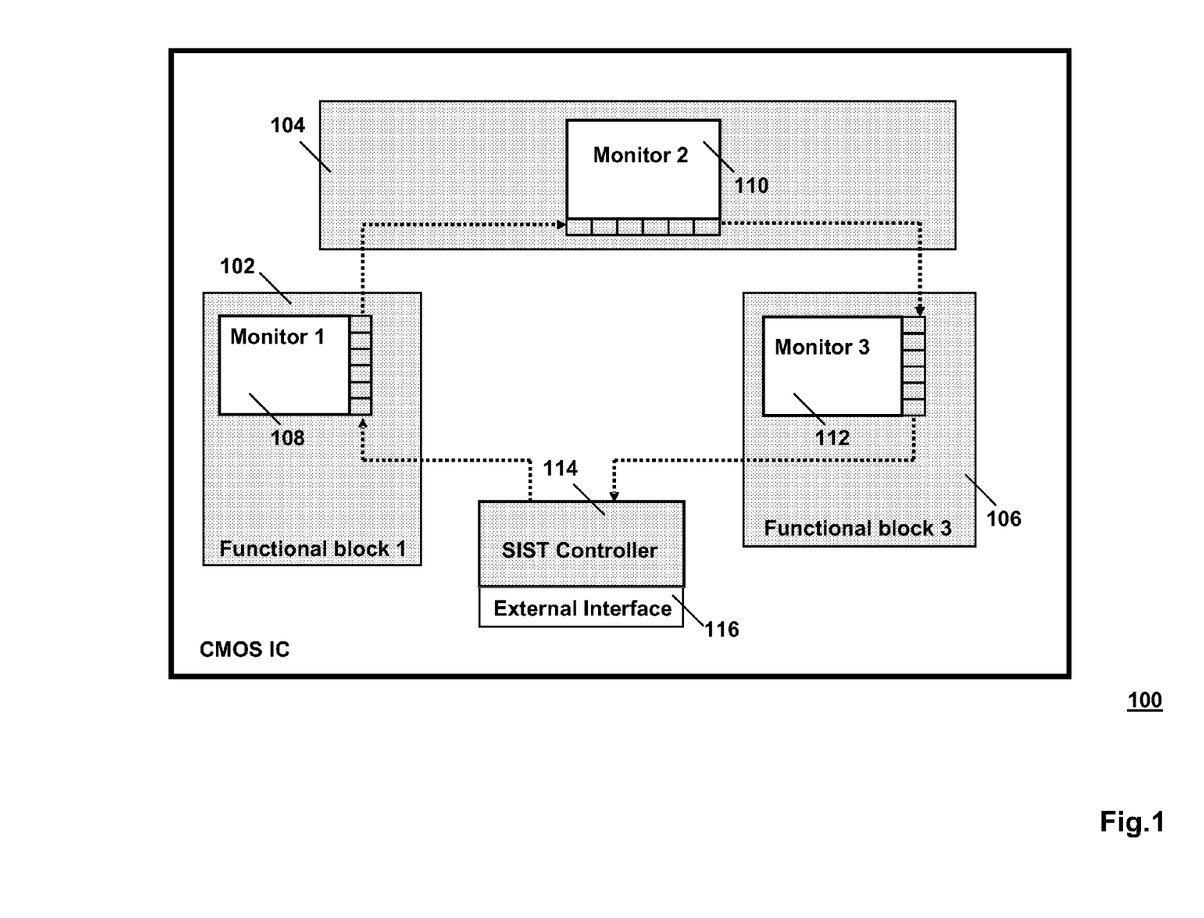
FIG. 1 is a block diagram of a integrated circuit chip with a signal-integrity self-test (SIST) configuration.

FIG. 1 is a block diagram of a CMOS chip 100 with a signal-integrity self-test (SIST) configuration. Chip 100 comprises functional blocks 102, 104 and 106. Each of blocks 102-106 performs a respective function appropriate to the operation of chip 100. Operation of blocks 102-106 is monitored by monitors 108, 110 and 112, respectively. Monitors 108-112 are connected through a bus to a SIST controller 114. Different types of monitors are used to measure different phenomena: cross talk, supply noise, substrate noise, temperature, switching activity, clock duty-cycle, technology parameters etc. Preferably, each of monitors 108-112 fits into the standard-cell library design style and affects the total design as little as possible. Monitors 108-112 preferably use the local power supply (not shown), generate their own reference values and can be fully switched off. All analog sensing and processing as well as the conversion into a digital format are done locally at the respective monitor. The outputs of monitors 108-112 are digital signals, which are transferred to SIST processor 114. Controller 114 has an external interface 116, e.g., based on the IEEE Standard Test Access Port and Boundary-Scan Architecture, described in IEEE Std 1149.1-1990. Further details of the SIST configuration are disclosed in WO2006056951, mentioned above and in "A Signal-Integrity Self-Test Concept for Debugging Nanometer CMOS ICs", Violeta Petrescu, Marcel Pelgrom Harry Veendrick, Praveen Pavithran, Jean Wieling, ISSCC Feb. 8, 2006, session 29.6, and in "Monitors for a signal integrity system", ESSCIRC 2006, Montreux, pp. 122-125 by the same authors.

Examples of parameters that can be monitored in above approach are temperature, voltage and current.

SUMMARY OF THE INVENTION

Another important parameter that one would like to monitor is clock signal jitter. Jitter in clock signals can cause temporal shifts in the position of clock signal flanks, which in turn lead to synchronization errors. See FIG. 2 discussed further below. A known way of inspecting this phenomenon involves the integration of sampled voltages to yield an analog error signal, which then has to be digitized. This is not considered to be a satisfactory approach to the problem in the current context.

The inventors therefore propose to employ a Delay Locked Loop (DLL) for measuring clock signal jitter. DLLs are known per se, and their use in clock signal analysis is also known. However, to date, DLLs have only been used to investigate sub-phases within a clock signal period. They have apparently not been used to examine temporal shift (delay/early arrival) of the flanks at the extremities of a clock signal period. Suppose that a clock signal period is sub-divided into $2^n$ regions, with n=5, for example (32 regions). The subdivision in a number of $2^n$ regions is chosen by way of example and for ease of practical implementation, but the invention is not restricted to exactly such numbers. In the traditional use of a DLL, one monitors the 32 regions within a clock signal period. However, in the current invention, some amount of overshoot is required, in order to be able to register temporal shift of a clock signal flank; therefore, one might in this case choose to monitor 32+5+5=42 regions, for example.

More specifically, the inventors propose an electronic circuit comprising a sensor for sensing jitter in a clock signal. The sensor comprises a delay-locked loop configuration for locking a clock signal and a delayed version of the clock signal. The sensor comprises a delay line having a first number of cascaded controllable (e.g., voltage controllable) delay segments. The delay-locked loop configuration uses a second number of the cascaded delay segments for generating a delay of an average clock period of the clock signal. The second number is smaller than the first number. The sensor comprises a comparator for supplying a sensor output signal representative of a comparison of the clock signal and a further delayed version of the clock signal. The further delayed version of the clock signal is obtained from an output of a specific one of the delay segments located in the delay line after the second number of cascaded delay segments.

The known jitter sensors use a DLL configuration for reducing clock jitter in the clocking systems. The invention uses part of the known configuration (delay line plus locking mechanism) for reducing clock jitter. However, the invention extends the delay line with one or more delay segments for obtaining the further delayed version of the clock signal in order to compare this with the current clock signal. As a result, the comparison relates to the most recent clock edge and a previous clock edge that lie a time period apart equal to the average clock period plus a predetermined fraction of the average clock period. In other words, the invention now enables to measure stretched clock signals.

In an embodiment of the circuit in the invention, the sensor comprises an array of multiple controllable switches. Each respective one of the switches is located between an output of a respective one of the cascaded delay segments and the comparator. The array has a control input for controllably selecting the specific delay segment. In this embodiment, the timing of the further delayed version of the clock signal can be programmed or otherwise controlled by means of selecting a proper one of the switches.

In a further embodiment, the clock signal is obtained from a further output of a particular one of the delay segments. This embodiment has the advantage that the clock signal, the delayed version of the clock signal, as used in the DLL, and the further delayed version of the clock signal are all scaled uniformly by the delay segments. Note that the delay line in the DLL configuration is dynamically controlled. By routing the clock signal, and the delayed versions via one or more delay segments, any transformation of a signal with respect to, e.g., amplitude is uniform to all signals. As a result, the comparison of the signals is not affected by non-uniformities.

In a further embodiment, the circuit of the invention comprises a data processing functional block, and the sensor output signal is operative to control the data processing. For example, if the sensor indicates an unacceptable amount of jitter, the sensor output can be used to render invalid the current processing of data in the functional block.

The invention also relates to a method of sensing jitter in a clock signal. The method comprises using a delay-locked loop configuration for locking a clock signal and a delayed version of the clock signal. The method uses a delay line having a first number of cascaded delay segments. The delay-locked loop configuration uses a second number of the cascaded delay segments for generating a delay of an average clock period of the clock signal. The second number is smaller than the first number. The method comprises generating an output signal representative of comparing the clock signal and a further delayed version of the clock signal. The further delayed version of the clock signal is obtained from an output of a specific one of the delay segments located in the delay line after the second number of cascaded delay segments. Advantages are as mentioned above with respect to the circuit of the invention.

In an embodiment of the method, the specific delay element is selected under control of a control signal. In this manner, the desired delay can be programmed or re-programmed.

In a further embodiment, the clock signal is obtained from a further output of a particular one of the delay segments. As mentioned above, subjecting the signals to uniform transformation with respect to, e.g., amplitude, ensures proper comparison actions.

In a further embodiment, the method comprises using the output signal for control of data processing by a data processing system. Such a method is particularly, but not exclusively, interesting to data processing systems accommodated on a chip (system-on-chip or "SoC") having a SIST configuration.

For completeness, reference is made to following publications, incorporated herein by reference:

US 20060122806 discloses a conventional jitter measurement circuit measuring clock jitter in an integrated circuit (IC) chip. The circuit has a delay-locked loop (DLL), which receives a clock signal. The DLL includes a voltage-controlled delay line (VCDL) having 8 adjustable, cascaded DLL delay elements (two inverting half delay circuits, for example) for delaying the clock signal in increments of the adjustable delay DLY so as to generate a delayed version of the clock signal; a phase detector array using one of a plurality of phase detectors for comparing the clock signal and the generated delayed version to generate a phase difference indicative of the clock jitter; and a feedback path responsive to the phase difference to adjust the delay through the VCDL such that the rising edges of the two signals at inputs of a selected phase detector are aligned and locked. The feedback path typically includes the selected phase detector of the array, a digital low-pass filter, an up/down counter, and a bias generator 28. A jitter recorder displays the measured phase jitter. Once the DLL has locked, it substantially reduces the phase difference between the clock signal and the delayed version at a selected phase detector to exactly one period of the clock signal. The known circuit uses an array of phase detectors. The array includes 16 phase detectors, in the form of flip-flops, which are designated by numbers 0-15. A first line, which has 8 array delay elements, receives the reference signal and progressively delays the reference signal before it passes to the phase detectors with numbers 8-15. A second line, which has 7 array delay elements, receives the clock signal and progressively delays the clock signal before it passes to the phase detectors with numbers 6-0. In contrast to this known circuit, the invention includes delay segments that are not located in the control loop of the DLL, but that are still controlled via the DLL, just as the delay segments within the control loop of the DLL. As a result, the delay of the delay segments in the invention and located outside the control loop, is uniformly controlled with the delay of the segments within the control loop. As a result, an accurate reference is obtained that is absent in the known circuit.

US 20080012549 relates to jitter measurement, and, more particularly, to a built-in self-test (BIST) circuit for measuring phase and/or cycle-to-cycle jitter of a clock signal. This publication discloses a delay locked loop (DLL) electrically connected to the clock signal generator and adapted to function as a coarse tune mode for jitter calculation (i.e., to lock the clock signal from the PLL half a period out of phase). It should be noted that in a typical implementation, the DLL would normally lock the clock signal one full period out of phase, but because the exemplary PLL has a frequency divider that divides by two, the subsequent measurements will actually be representative of cycle-to-cycle jitter be configured to delay the clock signal, to lock the clock signal when a predetermined phase shift is achieved, and, once locked, to output the clock signal as a delayed clock signal. The circuit also has a Vernier delay line (VDL) electrically connected to both the clock signal generator and the DLL and is adapted to function as a fine tune mode for jitter calculation (i.e., to compare edge transitions between the clock signal and the delayed clock signal). In contrast, the invention uses a delay line in the DLL for determining the average clock period and, in addition, one or more additional delay segments downstream thereof. As a result, the invention compares the most recent clock edge and a previous clock edge that lie a time period apart equal to the average clock period plus a predetermined fraction of the average clock period. In other words, the invention now enables to measure stretched clock signals.

US 20050024037 discloses a method and circuit for measuring on-chip, cycle-to-cycle, jitter. Copies of a circuit comprising a programmable delay line, a programmable phase comparator, and two counters are placed at different locations on an IC near a clock signal. The programmable delay line creates a clock signal that is delayed by one clock cycle. This delayed clock signal is compared to the original clock signal by the programmable phase comparator. If the difference between the delayed clock signal and the clock signal is greater than the dead time, the first counter is triggered. If the difference is negative and the absolute value is greater than the dead time, the second counter is triggered. A statistical distribution is created, based on the values of the counters. This distribution is used to predict on-chip, cycle-to-cycle jitter. This known circuit does not use a DLL configuration. Furthermore, this known circuit determines the statistical properties for a large number of clock cycles, not the actual position of a new clock edge.

US 20020053048 discloses circuitry with a clock generating circuit for generating an internal clock signal corresponding to an input clock signal received from an external source. The circuitry also comprises a measuring circuit for measuring a lock time of a PLL, measuring the maximum frequency of the internal clock signal and/or measuring jitter of the internal clock signal. An embodiment of the measuring circuit automatically measures the cycle (period) jitter of the internal clock signal generated by the PLL, i.e., time fluctuation of the internal clock. The measuring circuit comprises a DLL receiving the internal clock signal. The DLL comprises a first controllable delay circuit for delaying the internal clock signal, and a phase comparator for comparing the phases of the internal clock signal and the delayed version thereof. The comparator supplies a control signal to the delay circuit so as to lock the internal clock signal and the delayed version thereof having a phase difference of a single clock period of the internal clock signal. The measuring circuit comprises a second controllable delay circuit that receives as input the internal clock signal, and that is controlled by the same control signal as is supplied to the first delay circuit. As a result the further delay circuit delays the internal clock signal by a single clock period as well. An output of the second controllable delay circuit is connected to an input of a third delay circuit. The third delay circuit is used to fine-tune the delay of the internal clock signal. To this end, the third delay circuit comprises a cascade of inverters whose capacitive loads are digitally controllable so as to adjust the additional delay. The accumulated delay of the internal clock signal upon passing through the second and third delay circuits, amounts to substantially one clock period. The internal clock signal and the thus delayed version thereof are respectively supplied to the data terminal and clock terminal of a flip-flop for phase comparison. When the rising edge of the internal clock signal precedes the rising edge of the delayed version, the flip-flop supplies a logic high. When the rising edge of the internal clock signal succeeds the rising edge of the delayed version, the flip-flop supplies a logic low. A counter at the output of the flip-flop counts the number of logic lows. This number is then used for statistical purposes. In contrast, the first portion of the delay line of the sensor in the invention forms an integral part of the DLL, and all delay segments of the entire delay line are controlled via the DLL's control signal.

BRIEF DESCRIPTION OF THE DRAWINGS

The invention is explained in further detail, by way of example and with reference to the accompanying drawing, wherein.

Throughout the Figures, similar or corresponding features are indicated by same reference numerals.

DETAILED DESCRIPTION OF THE EMBODIMENTS

Figure 2:
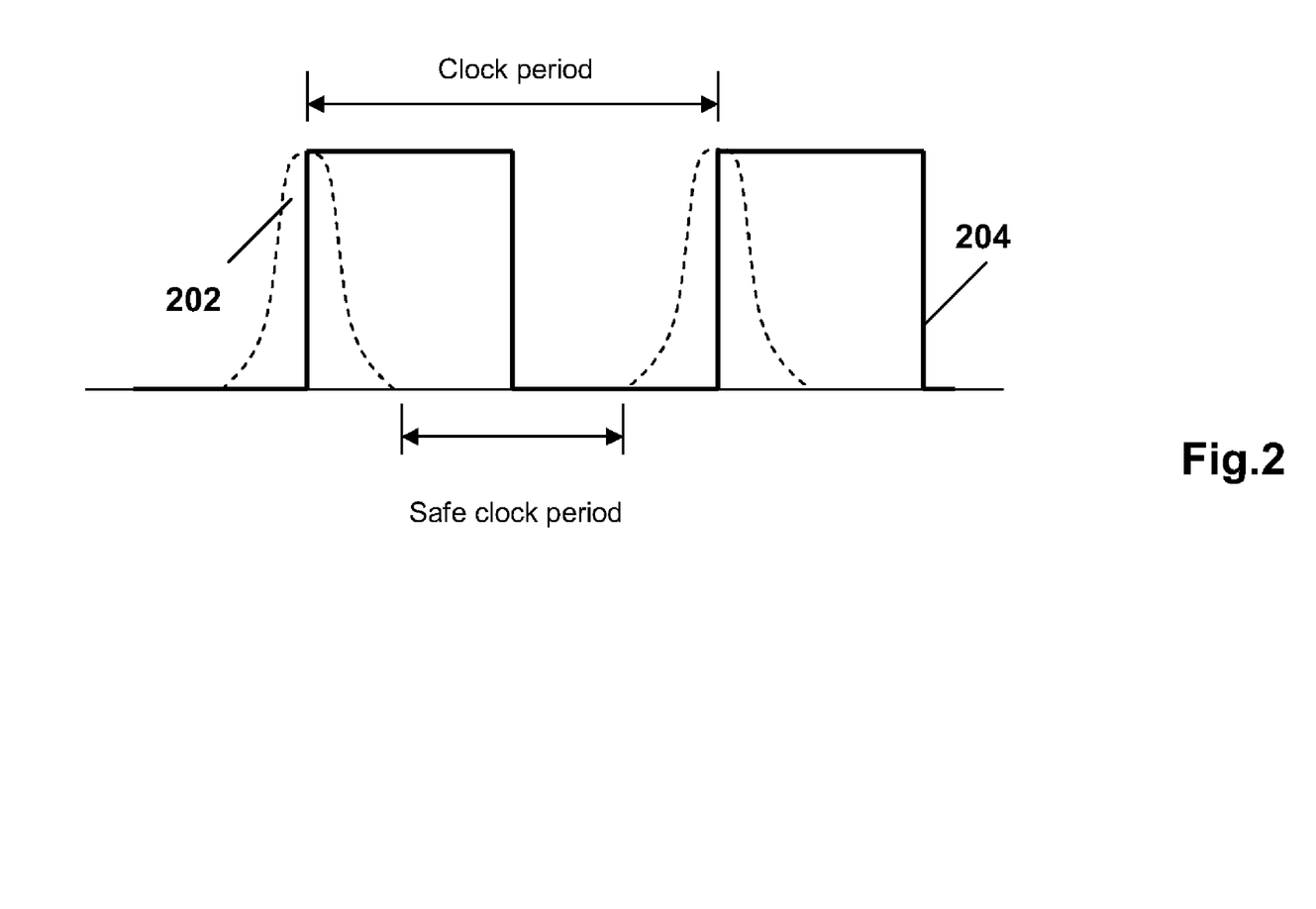
FIG. 2 is a timing diagram illustrating jitter.

In order to measure jitter in (clock) signals on a digital chip, a jitter sensor is needed. The jitter sensor measures the jitter of individual clock edges with respect to the previous edge as a fraction of the average clock cycle. The term "jitter" is typically used to refer to abrupt and unwarranted variation of a signal characteristic. As illustrated in FIG. 2, the jitter 202 in a clock signal 204 causes uncertainty in the occurrence of the flanks of signal 204, thereby reducing the time interval available and limiting the maximum speed of a data processor. Jitter 202 is represented in FIG. 2 as a distribution function signifying the probability density in time of the occurrence of the relevant flank. Jitter can stem from a variety of sources: noise on the supply lines and ground; crosstalk or interference from other signals; noise in the semiconductor substrate of an integrated circuit; thermal, shot and 1/f noise of active and passive devices in the clock generation circuitry. Some of these sources have a random behavior and their noise has a Gaussian profile. Others give rise to non-Gaussian noise, such as the voltage noise on the supply lines that may have a systematic character. The invention addresses measurement of jitter caused by these and other phenomena. In the invention, the phenomenon of period jitter is addressed. Period jitter refers to the deviation of the clock period from the actual clock period.

Figure 3:
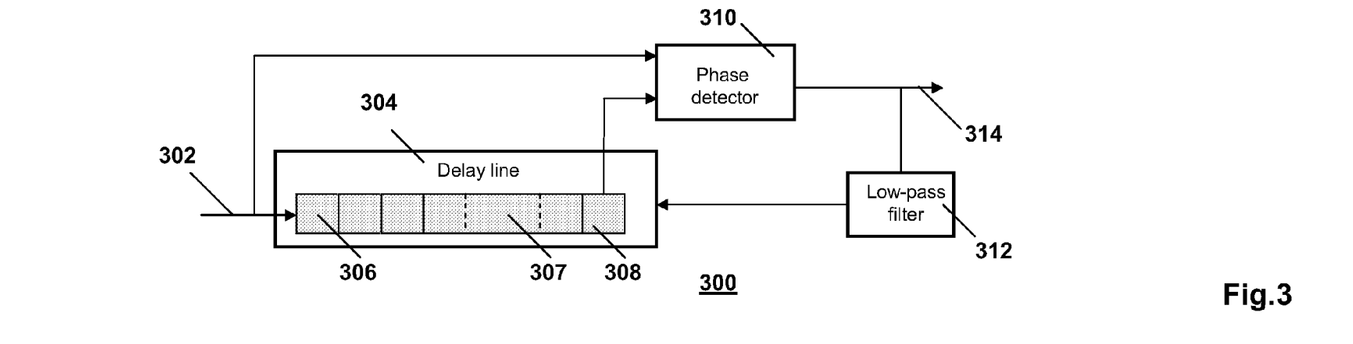
FIG. 3 is a diagram of a known jitter measurement circuit.

FIG. 3 is a circuit diagram of a known jitter measurement circuit 300 for measuring clock jitter in an IC chip. Clock jitter refers to the temporal variation of a clock period at a given point on the chip, i.e., the clock period may reduce or expand on a cycle-by-cycle basis. Circuit 300 has a configuration of a delay-locked loop (DLL). Circuit 300 receives a clock signal at an input 302. Circuit 300 includes an adjustable, e.g., voltage-controlled, delay line 304 having a number of adjustable, cascaded DLL delay segments, of which only first segment 306, an intermediate segment 307 and last segment 308 have been indicated in order to not obscure the drawing. Segment 306 receives via input 302 the clock signal that is also supplied to one of the inputs of detector 310. Segment 308 supplies the delayed clock signal to another input of detector 310. Segmented delay line 304 thus enables to delay the clock signal in increments of the delay provided by a single adjustable segment. Circuit 300 further comprises a phase detector 310 for comparing the clock signal and the delayed clock signal so as to generate a signal indicative of the phase difference that in turn represents the time difference between the incoming clock edge and the delayed edge. The signal generated by detector 310 is fed back to a control input of adjustable delay line 304 through a low-pass filter 312. The feedback loop serves to adjust the delay through delay line 304 such that the rising edges of the two signals at the inputs of phase detector 308 become aligned and locked. That is, the delay between input 302 and the output of segment 308 will become equal to the time-average of the clock period of the clock signal received at input 302. The signal supplied by detector 310 to an output 314 can then be processed as a measurement of the currently detected jitter. A slow DLL configuration, as determined by the time constant of low-pass filter 312, ensures locking to the average clock period.

Figure 4:
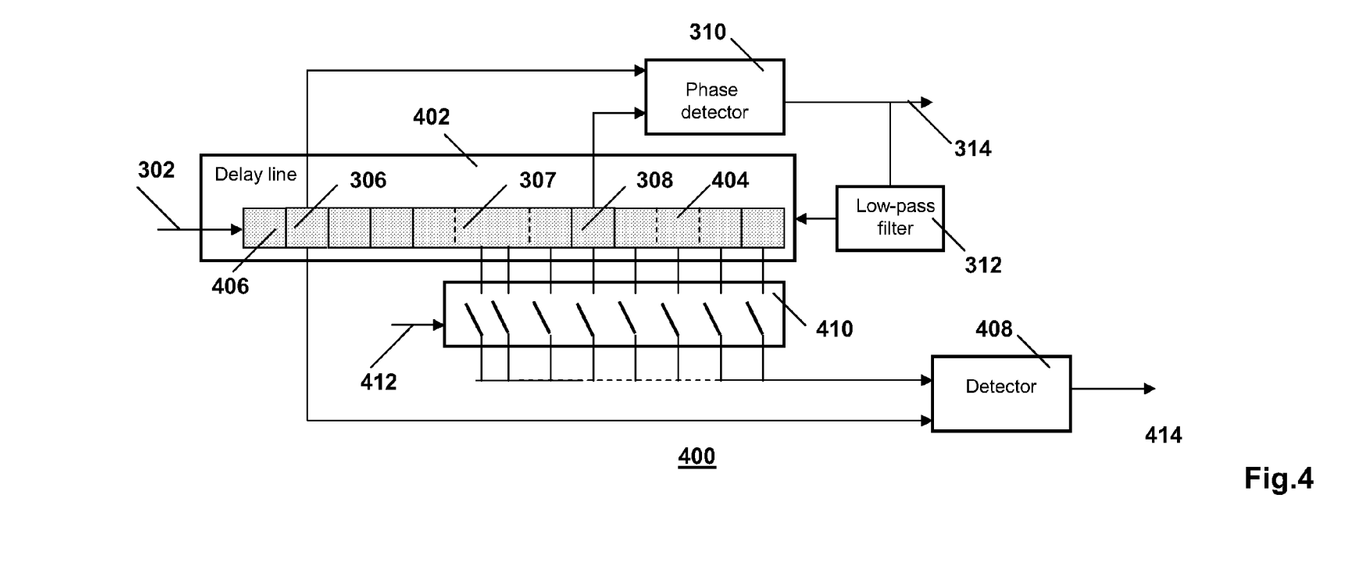
FIGS. 4 and 5 are diagrams of jitter measurement circuits of the invention.

FIG. 4 is a circuit diagram of a jitter measurement circuit 400 in the invention. Circuit 400 includes the configuration of circuit 300, but has additional components. Circuit 400 comprises a delay line 402 that, in the example shown, has additional segments, e.g., segment 404, downstream of segment 308 and one or more additional segments, e.g., segment 406 upstream of segment 306. One, some or all of the delay segments of delay line 402 each have a tap to supply the output signal of the relevant segment to detector 408. In the example shown, multiple taps are shown from which a single one can be selected for being connected to detector 408. A manner to implement this is to provide controllable switches 410, from which a particular one can be set to the closed position under control of a control signal at a control input 412, so as to connect a single tap to detector 408. Instead of controllable switches 410 for selecting a specific tap, one could have a single tap as the output of a specific delay segment permanently connected to detector 408 in a fixed configuration.

As an additional option, a string of, e.g., two resistors is connected to two outputs of the delay line via two switches. Varying the resistance value of the resistors allows defining intermediate flanks of the delayed clock signal. This passive interpolation technique is further explained, albeit within the context of a time-to-digital converter, in "A 90 nm 4.7 ps-Resolution 0.7 LSB Single-Shot Precision and 19 pJ-per-Shot Local Passive Interpolation Time-to-Digital Converter with On-Chip Characterization", S. Henzler et al., ISSCC 2008, pp. 548-549, but could be used in an embodiment of the present invention as well.

Detector 408 also receives the clock signal as supplied to detector 408. In the example shown, the clock signal as supplied to detectors 408 and 310 for being compared to a delayed version thereof, is itself supplied via one or more delay segments located at the head of delay line 402. Segment 406 that connects input 302 to the rest of delay line 402 serves to avoid differences in timing due to non-uniformity of the signals. This non-uniformity can occur if, e.g. the signal at input 302 has a source impedance that is substantially different from the source impedance of the outputs of the segments of delay line 402. It is advisable to use additional segment 406 if the signal levels of the signal at input 302 and the signal levels at the outputs of the delay line are not equivalent.

For completeness, a tapped delay line in a DLL configuration is known in, e.g., clock multipliers as discussed in, e.g., "Analysis of Random Jitter in a Clock Multiplying DLL Architecture", R. C. H. van de Beek, E. A. M. Klumperink, C. S. Vaucher and B. Nauta, presented at ProRisc, 2001, pp 281-287.

Assume that the cascade of delay segments, from segment 306 up to and including delay segment 308, comprises N delay segments. Assume that segment 307 is the K-th segment in this cascade, with K smaller than N. Now assume that the signals at the output of segments 306 and 307 are monitored via detector 408. The output signal of segment 307 is delayed by a fraction of K/N of the average clock period. In detector 408, the output signal of segment 307 is compared with the currently present signal at the output of segment 306. This enables one to detect whether there are clock cycles that have a period shorter than K/N times the average clock cycle.

Now consider that the only closed switch among switches 410 is the one connecting segment 404 to detector 408. Segment 404 is located downstream of segment 308, the last one in delay line 402 that serves in the feedback loop of the DLL configuration. That is, the output of segment 404 has a delay of M/N times the average clock period, wherein M is larger than N. This enables one to detect whether there are clock cycles that have a period longer than M/N times the average clock cycle. In other words, this approach enables to compare the most recent clock edge and the previous clock edge plus a predetermined fraction of the average clock period. As a result, circuit 400 allows the detection of every exceeding of the acceptable jitter. Circuit 400 can be accommodated in a larger data processing system, e.g., the one implemented on chip 100 of FIG. 1. Output 414 can then be used to control the local data processing by means of signaling whether the current value of the clock signal is acceptable or not. In the latter case, data processing results produced under control of the current clock signal are discarded.

Figure 5:
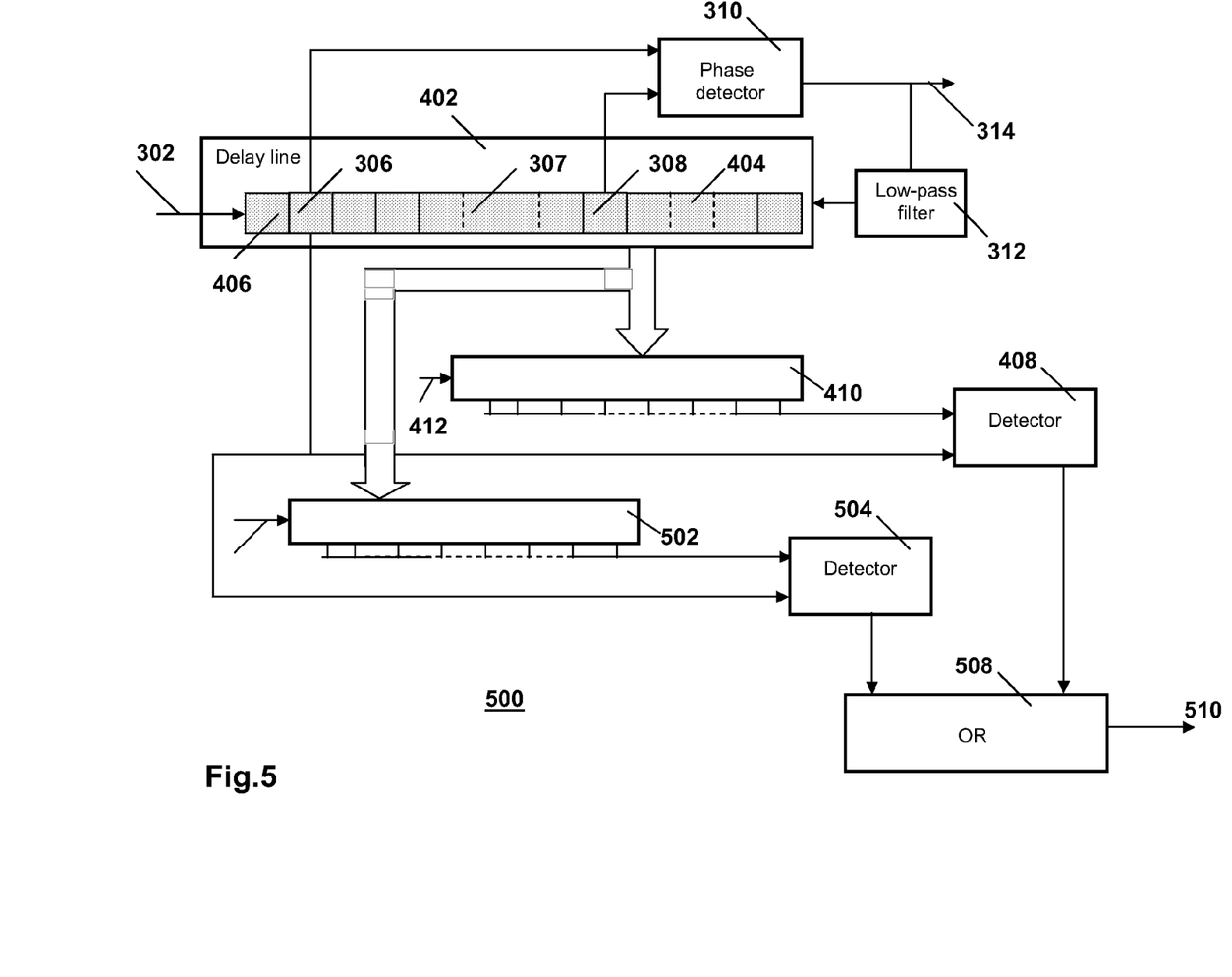

FIG. 5 is a diagram of a jitter measurement circuit 500 that generalizes the approach of circuit 400. Circuit 500 comprises an additional set of switches 502 connected between delay line 402 and a further detector 504. Switches 502 have a control input 506 for selecting which specific one of switches 502 connects the associated one of the delay segments of delay line 402 to further detector 504. As mentioned above, instead of having arrays of switches 410 and 502, one could have a single fixed connection between a particular delay segment of delay line 402 and detector 408, and another single fixed connection between another particular delay segment of delay line 402 and detector 504. Switches 410 can be set to detect whether there are clock cycles that have a period shorter than K/N times the average clock cycle, with K<N. Detector 408 outputs one of a logic high and a logic low, dependent on whether or not such cycle has been detected. Switches 502 can be set to detect whether there are clock cycles that have a period longer than M/N times the average clock cycle, M>N. Detector 504 outputs one of a logic high and logic one dependent on whether or not such cycle has been detected. The combination of detectors 408 and 504 thus enables to detect whether there are clock cycles with a period whose length lies between K/N times the average clock cycle and M/N times the average clock cycle, wherein integers K and M are determined by those specific delay segments of delay line 402 whose output is being tapped. Accordingly, by combining the outputs of detectors 408 and 504 in a combiner 508, e.g., a logic OR gate, a window can be set for jitter values. Within the window the jitter is acceptable and outside the window the jitter is unacceptable. The signal at an output 510 of combiner 508 indicates whether or not the jitter was acceptable. This signal can be used to control data processing in a similar manner as mentioned above with reference to FIG. 4.

Further to circuits 400 and 500, instead of a single one per array 410 and/or a single one of array 502, one could activate multiple ones of the switches 410 and/or 502 so as to generate a thermometer code. This configuration allows setting a time-window wherein the incoming edge of the input signal at input 302 has to occur. Both too-early and too-late events can be found with this configuration.

The invention claimed is:

1. An electronic circuit comprising a sensor for sensing jitter in a clock signal, wherein:
   the sensor comprises a delay-locked loop configuration for locking a clock signal and a delayed version of the clock signal;
   the sensor comprises a delay line having a first number of cascaded controllable delay segments;
   the delay-locked loop configuration uses a second number of the cascaded delay segments for generating a delay of an average clock period of the clock signal;
   the second number is smaller than the first number;
   the sensor comprises a comparator for supplying a sensor output signal representative of a comparison of the clock signal and a further delayed version of the clock signal; and
   the further delayed version of the clock signal is obtained from an output of a specific one of the delay segments located in the delay line after the second number of cascaded delay segments.

2. The circuit of claim 1, wherein:
   the sensor comprises an array of multiple controllable switches;
   each respective one of the switches is located between an output of a respective one of the cascaded delay segments and the comparator; and
   the array has a control input for controllably selecting the specific delay segment.

3. The circuit of claim 1, wherein the clock signal is obtained from a further output of a particular one of the delay segments.

4. The circuit of claim 1, comprising a data processing system, and wherein the sensor output signal is operative to control the data processing.

5. A method of sensing jitter in a clock signal, the method comprising using a delay-locked loop configuration for locking a clock signal and a delayed version of the clock signal, wherein:
   the method uses a delay line having a first number of cascaded controllable delay segments;

the delay-locked loop configuration uses a second number of the cascaded delay segments for generating a delay of an average clock period of the clock signal;

the second number is smaller than the first number;

the method comprises generating an output signal representative of comparing the clock signal and a further delayed version of the clock signal; and the further delayed version of the clock signal is obtained from an output of a specific one of the delay segments located in the delay line after the second number of cascaded delay segments.

6. The method of claim 5, comprising selecting the specific delay element under control of a control signal.

7. The method of claim 5, comprising obtaining the clock signal from a further output of a particular one of the delay segments.

8. The method of claim 5, comprising using the output signal for control of data processing by a data processing system.

* * * * *